(12) United States Patent
Inoue

(10) Patent No.: US 11,081,672 B2
(45) Date of Patent: Aug. 3, 2021

(54) RESIN FILM FOR ELECTRONIC DEVICES, AND ELECTRONIC DEVICE

(71) Applicant: ZEON CORPORATION, Tokyo (JP)

(72) Inventor: Hiroyasu Inoue, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 16/472,976

(22) PCT Filed: Feb. 15, 2018

(86) PCT No.: PCT/JP2018/005342
§ 371 (c)(1),
(2) Date: Jun. 24, 2019

(87) PCT Pub. No.: WO2018/155311
PCT Pub. Date: Aug. 30, 2018

(65) Prior Publication Data
US 2020/0172686 A1    Jun. 4, 2020

(30) Foreign Application Priority Data

Feb. 23, 2017  (JP) .............................. JP2017-032166

(51) Int. Cl.
| | |
|---|---|
| *H01L 51/52* | (2006.01) |
| *C08F 297/04* | (2006.01) |
| *C08K 3/26* | (2006.01) |
| *C08K 3/34* | (2006.01) |
| *G02B 1/10* | (2015.01) |
| *B32B 17/10* | (2006.01) |

(52) U.S. Cl.
CPC .......... *H01L 51/5259* (2013.01); *B32B 17/10* (2013.01); *C08F 297/04* (2013.01); *C08K 3/26* (2013.01); *C08K 3/34* (2013.01); *G02B 1/10* (2013.01); *C08F 2810/00* (2013.01); *C08J 2353/02* (2013.01); *C08K 2003/267* (2013.01); *C08K 2003/343* (2013.01); *H01L 51/5253* (2013.01)

(58) Field of Classification Search
CPC .. B32B 7/00–7/14; B32B 27/00–27/42; C08L 53/00–53/025; C09J 153/00–153/025; C08K 3/24–3/36; H01L 51/00–51/56; H05B 33/00–33/28
See application file for complete search history.

(56) References Cited

U.S. PATENT DOCUMENTS

| | | |
|---|---|---|
| 5,191,024 A | 3/1993 | Shibata et al. |
| 5,206,301 A | 4/1993 | Hattori et al. |
| 5,216,074 A | 6/1993 | Imai et al. |
| 5,306,779 A | 4/1994 | Shibata et al. |
| 5,346,964 A | 9/1994 | Shibata et al. |
| 7,622,199 B2 | 11/2009 | Tanaka et al. |
| 9,391,293 B2 | 7/2016 | Cho et al. |
| 2010/0172028 A1 | 7/2010 | Kamei et al. |
| 2013/0244367 A1* | 9/2013 | Kohara ................... B32B 27/18 438/64 |
| 2016/0020426 A1 | 1/2016 | Aoyama et al. |
| 2016/0343970 A1 | 11/2016 | Tazaki et al. |

FOREIGN PATENT DOCUMENTS

| | | |
|---|---|---|
| CN | 101680973 A | 3/2010 |
| CN | 105122939 A | 12/2015 |
| JP | H02133406 A | 5/1990 |
| JP | H02305814 A | 12/1990 |
| JP | H0372512 A | 3/1991 |
| JP | H0374409 A | 3/1991 |
| JP | 2005213410 A | 8/2005 |
| JP | 2005298598 A | 10/2005 |
| JP | 2006272190 A * | 10/2006 |
| JP | 2009229507 A | 10/2009 |
| JP | 2010080293 A | 4/2010 |
| JP | 2014133807 A | 7/2014 |
| JP | 2014162827 A | 9/2014 |
| JP | 2015504457 A | 2/2015 |
| WO | 2008153139 A1 | 12/2008 |
| WO | 2014156555 A1 | 10/2014 |
| WO | 2015099079 A1 | 7/2015 |

OTHER PUBLICATIONS

Machine translation of JP2006272190. Retrieved Aug. 13, 2020.*
Wood, R.W. "The Invisibility of Transparent Objects". Phys. Rev. (Series I), vol. 15, No. 2, (1902); pp. 123-124.*
DeArmitt et al. (ed. Kutz, M.). "Dispersants and Coupling Agents". Applied Plastics Engineering Handbook: Processing and Materials, 1st ed., (2011); pp. 441-454.*
"Dispersing Technology". Munzing, (2016); pp. 1-13.*
Apr. 24, 2018, International Search Report issued in the International Patent Application No. PCT/JP2018/005342.
Aug. 27, 2019, International Preliminary Report on Patentability issued in the International Patent Application No. PCT/JP2018/005342.

* cited by examiner

*Primary Examiner* — Prashant J Khatri
(74) *Attorney, Agent, or Firm* — Kenja Ip Law PC

(57) ABSTRACT

Provided is a resin film for an electronic device including: a resin containing a polymer; hygroscopic particles dispersed in the resin and having a primary particle diameter of 200 nm or less; and a dispersant, wherein an absolute value of a difference in refractive index between the resin and the particles is 0.05 or less. The resin is preferably a thermoplastic resin, and more preferably a thermoplastic elastomer. The polymer is preferably one or more types selected from an aromatic vinyl compound-conjugated diene copolymer and a hydrogenated aromatic vinyl compound-conjugated diene copolymer. An electronic device including the resin film for an electronic device is also provided.

8 Claims, No Drawings

RESIN FILM FOR ELECTRONIC DEVICES, AND ELECTRONIC DEVICE

FIELD

The present invention relates to a resin film for electronic devices and an electronic device.

BACKGROUND

In electronic devices such as an organic electroluminescent light-emitting device (hereinafter also appropriately referred to as "organic EL light-emitting device"), a resin film is used for the purpose of, e.g., sealing. As an example of such a resin film for electronic devices, a film which prevents the intrusion of water into a light emitting layer and the like of the organic EL light-emitting device and has high adhesion to a substrate interface has been studied.

As such a film, there has been proposed an adhesive film which includes an adhesive layer containing a hygroscopic filler as a portion of the layer that constitutes the adhesive layer and thus exhibits a further improved effect of preventing the intrusion of water into the light emitting layer and the like (Patent literature 1).

CITATION LIST

Patent Literature

Patent Literature 1: Japanese Translation of PCT Patent Application Publication No. 2015-504457 A (corresponding publication: U.S. Patent Application Publication No. 2014/091296)

SUMMARY

Technical Problem

In most cases, a film that includes a layer containing hygroscopic particles includes, in addition to the hygroscopic agent, an additive or the like for dispersing the hygroscopic agent, which may inhibit the adhesion to the device. Further, some hygroscopic agent in use may elevate haze, and transparency required for the device may not be achieved.

Thus, an object of the present invention is to provide a resin film for electronic devices having high transparency and high adhesion to the device, and an electronic device including the resin film.

Solution to Problem

The present inventor has conducted studies to solve the aforementioned problems. As a result, the present inventor has found that a resin film for electronic devices capable of achieving both transparency and adhesion property can be obtained by addition of hygroscopic particles having a specific particle diameter, in which a difference in refractive index between the particle and the resin falls within a specific range; and a dispersant; to a polymer-containing resin. Thus, the present invention has been completed.

Accordingly, the present invention provides the following.

<1> A resin film for an electronic device comprising:
a resin containing a polymer;
hygroscopic particles dispersed in the resin and having a primary particle diameter of 200 nm or less; and
a dispersant, wherein
an absolute value of a difference in refractive index between the resin and the particles is 0.05 or less.

<2> The resin film for an electronic device according to <1>, wherein the resin is a thermoplastic resin.

<3> The resin film for an electronic device according to <2>, wherein the thermoplastic resin is a thermoplastic elastomer.

<4> The resin film for an electronic device according to any one of <1> to <3>, wherein the polymer is one or more types selected from an aromatic vinyl compound-conjugated diene copolymer and a hydrogenated aromatic vinyl compound-conjugated diene copolymer.

<5> The resin film for an electronic device according to <4>, wherein the aromatic vinyl compound-conjugated diene copolymer is an aromatic vinyl compound-conjugated diene block copolymer.

<6> The resin film for an electronic device according to <5>, wherein the aromatic vinyl compound-conjugated diene block copolymer is one or more types selected from a styrene-butadiene block copolymer, a styrene-butadiene-styrene block copolymer, a styrene-isoprene block copolymer, and a styrene-isoprene-styrene block copolymer.

<7> The resin film for an electronic device according to <4>, wherein the hydrogenated aromatic vinyl compound-conjugated diene copolymer is a hydrogenated aromatic vinyl compound-conjugated diene block copolymer.

<8> The resin film for an electronic device according to <7>, wherein the hydrogenated aromatic vinyl compound-conjugated diene block copolymer is one or more types selected from a hydrogenated styrene-butadiene block copolymer, a hydrogenated styrene-butadiene-styrene block copolymer, a hydrogenated styrene-isoprene block copolymer, and a hydrogenated styrene-isoprene-styrene block copolymer.

<9> The resin film for an electronic device according to <7> or <8>, wherein the hydrogenated aromatic vinyl compound-conjugated diene block copolymer is a hydrogenated aromatic vinyl compound-conjugated diene block copolymer in which both an unsaturated bond of the conjugated diene and an aromatic ring are hydrogenated.

<10> The resin film for an electronic device according to any one of <1> to <8>, wherein the resin contains as the polymer a polymer having a polar group.

<11> The resin film for an electronic device according to <10>, wherein the polymer having a polar group is a graft polymer containing a polar group-containing unit.

<12> The resin film for an electronic device according to any one of <1> to <11>, wherein a storage elastic modulus at 25° C. thereof is $10^7$ Pa or more and $10^9$ Pa or less.

<13> The resin film for an electronic device according to any one of <1> to <12>, wherein a thickness thereof is 0.1 μm or more and 1000 μm or less.

<14> The resin film for an electronic device according to any one of <1> to <13>, wherein an internal haze thereof is 6.0% or less.

<15> An electronic device comprising the resin film for an electronic device according to any one of <1> to <14>.

Advantageous Effects of Invention

The resin film for electronic device of the present invention can be used as a resin film for an electronic device and, in such a use, both high transparency and high adhesion to devices can be achieved.

Further, the electronic device of the present invention, which includes the resin film capable of achieving both high transparency and high adhesion property, can provide transparency required when adopted in a display and offers the device in which the intrusion of water is prevented.

DESCRIPTION OF EMBODIMENTS

Hereinafter, the present invention will be described in detail with reference to embodiments and examples. However, the present invention is not limited to the following embodiments and examples, and may be freely modified for implementation without departing from the scope of claims of the present invention and the scope of their equivalents.

[1. Summary of Resin Film for an Electronic Device]

A resin film for an electronic device (this may be referred to hereinafter as "resin film") of the present invention includes a polymer-containing resin, hygroscopic particles having a primary particle diameter of 200 nm or less (hereinafter, this particle may be simply referred to as "hygroscopic particle") dispersed in the resin, and a dispersant. An absolute value of the difference in refractive index between the resin and the hygroscopic particles included in the resin film of the present invention is 0.05 or less.

[2. Resin]

In the present invention, as the polymer-containing resin, a thermoplastic resin is preferable from the viewpoint of molding facilitation. As such a thermoplastic resin, a thermoplastic elastomer is preferable from the viewpoints of molding facilitation and low tendency to cause rupture.

The thermoplastic elastomer refers to a material which exhibits characteristics of rubber at a normal temperature and becomes plasticized at a high temperature for allowing molding processing. Such a thermoplastic elastomer has characteristics of low tendency to cause stretch or rupture with a load of small force.

Specifically, the thermoplastic elastomer has the Young's modulus of 0.001 to 1 GPa and the tensile elongation (the rupture elongation) of 100 to 1,000% at 23° C. Further, in a high temperature range of 40° C. or higher and 200° C. or lower, the storage elastic modulus of the thermoplastic elastomer steeply drops and the loss tangent tan δ (the loss elastic modulus/the storage elastic modulus) shows a peak or indicates a value exceeding 1, resulting in softening. The Young's modulus and the tensile elongation may be measured according to JIS K7113. Further, the loss tangent tan δ may be measured by a commercially available dynamic viscoelasticity measuring device.

Generally, the thermoplastic elastomer does not include a remaining solvent, or even if it does, the amount of the remaining solvent is small, and thus the thermoplastic elastomer causes little outgas. Therefore, the thermoplastic elastomer has low tendency to generate gas under a low-pressure environment, and thereby the resin film can be prevented from becoming a gas generation source by itself. Further, unlike a thermosetting resin and a photocurable resin, a crosslinking treatment in the middle of processing is not required, which can simplify steps of the processing.

[2.1. Polymer]

The resin contains a polymer as a main component.

Examples of the polymers may include: an ethylene-α-olefin copolymer such as an ethylene-propylene copolymer; an ethylene-α-olefin-polyene copolymer; a copolymer of ethylene and an unsaturated carboxylic acid ester such as ethylene-methyl methacrylate and ethylene-butyl acrylate; a copolymer of ethylene and a vinyl fatty acid such as ethylene-vinyl acetate; a polymer of an acrylic acid alkyl ester such as ethyl acrylate, butyl acrylate, hexyl acrylate, 2-ethylhexyl acrylate, and lauryl acrylate; a diene-based copolymer such as polybutadiene, polyisoprene, an acrylonitrile-butadiene copolymer, a butadiene-isoprene copolymer, a butadiene-(meth)acrylic acid alkyl ester copolymer, a butadiene-(meth)acrylic acid alkyl ester-acrylonitrile copolymer, and a butadiene-(meth)acrylic acid alkyl ester-acrylonitrile-styrene copolymer; a butylene-isoprene copolymer; an aromatic vinyl compound-conjugated diene copolymer such as a styrene-butadiene random copolymer, a styrene-isoprene random copolymer, a styrene-butadiene block copolymer, a styrene-butadiene-styrene block copolymer, a styrene-isoprene block copolymer, and a styrene-isoprene-styrene block copolymer; a hydrogenated aromatic vinyl compound-conjugated diene copolymer such as a hydrogenated styrene-butadiene random copolymer, a hydrogenated styrene-isoprene random copolymer, a hydrogenated styrene-butadiene block copolymer, a hydrogenated styrene-isoprene block copolymer, a hydrogenated styrene-isoprene block copolymer, and a hydrogenated styrene-isoprene-styrene block copolymer; and a low crystallizable polybutadiene, a styrene grafted ethylene-propylene elastomer, a thermoplastic polyester elastomer, and an ethylenic ionomer. As the polymers, one type thereof may be solely used, and two or more types thereof may also be used in combination at any ratio.

The polymer is preferably one or more types selected from an aromatic vinyl compound-conjugated diene copolymer and a hydrogenated aromatic vinyl compound-conjugated diene copolymer from the viewpoint of low water absorption and not deteriorating the lifetime of electronic devices, and from the viewpoint of easily controlling the processing temperature by changing the copolymerization ratio.

As the aromatic vinyl compound-conjugated diene copolymer, an aromatic vinyl compound-conjugated diene block copolymer is preferable. The aromatic vinyl compound-conjugated diene block copolymer is preferably one or more types selected from a styrene-butadiene block copolymer, a styrene-butadiene-styrene block copolymer, a styrene-isoprene block copolymer, and a styrene-isoprene-styrene block copolymer.

As the hydrogenated aromatic vinyl compound-conjugated diene copolymer, a hydrogenated aromatic vinyl compound-conjugated diene block copolymer is preferable. The hydrogenated aromatic vinyl compound-conjugated diene block copolymer is preferably one or more types selected from a hydrogenated styrene-butadiene block copolymer, a hydrogenated styrene-butadiene-styrene block copolymer, a hydrogenated styrene-isoprene block copolymer, and a hydrogenated styrene-isoprene-styrene block copolymer. More specific examples of these may include those described in prior art literatures such as Japanese Patent Application Laid-Open No. Hei. 2-133406 A, Japanese Patent Application Laid-Open No. Hei. 2-305814 A, Japanese Patent Application Laid-Open No. Hei. 3-72512 A, Japanese Patent Application Laid-Open No. Hei. 3-74409 A, and International Publication No. WO2015/099079.

As the hydrogenated aromatic vinyl compound-conjugated diene block copolymer, a hydrogenated aromatic vinyl compound-conjugated diene block copolymer in which both the unsaturated bonds of the conjugated diene and the aromatic ring are hydrogenated is preferable.

The hydrogenated aromatic vinyl compound-conjugated diene block copolymer (this may be referred to as "hydrogenated product") is a polymer obtained by hydrogenating the carbon-carbon unsaturated bonds in the main chain and the side chain of the aromatic vinyl compound-conjugated diene block copolymer and the carbon-carbon of the aromatic ring. The hydrogenation rate is usually 90% or more, preferably 97% or more, and more preferably 99% or more. The higher the hydrogenation rate, the better heat resistance and light resistance of the thermoplastic elastomer. Herein, the hydrogenation rate of the hydrogenated product may be obtained by measurement by $^1$H-NMR.

The hydrogenation rate of the carbon-carbon unsaturated bonds in the main chain and the side chain of the block copolymer is preferably 95% or more, and more preferably 99% or more. By increasing the hydrogenation rate of the carbon-carbon unsaturated bonds in the main chain and the side chain of the block copolymer, light resistance and oxidation resistance of the resin can be further increased.

The hydrogenation rate of the carbon-carbon unsaturated bonds of the aromatic ring of the block copolymer is preferably 90% or more, more preferably 93% or more, and particularly preferably 95% or more. By increasing the hydrogenation rate of the carbon-carbon unsaturated bonds of the aromatic ring, the glass transition temperature of the hydrogenated product is increased. Consequently, the heat resistance of the resin can be effectively increased. Furthermore, the photoelastic coefficient of the resin can be lowered to reduce the expression of retardation when the resin film is used as, for example, an adhesive layer.

A particularly preferable block form of the hydrogenated aromatic vinyl compound-conjugated diene block copolymer is a triblock copolymer in which blocks [A] of a hydrogenated product of an aromatic vinyl polymer are bonded to both ends of a block [B] of a hydrogenated product of a conjugated diene polymer; and a pentablock copolymer in which the polymer blocks [B] are bonded to both ends of the polymer block [A] and polymer blocks [A] are bonded to the respective other ends of the both polymer blocks [B]. In particular, a triblock copolymer of [A]-[B]-[A] is particularly preferable because production thereof can be easily performed and physical properties thereof as a thermoplastic elastomer can be adjusted in desired ranges.

As to the hydrogenated aromatic vinyl compound-conjugated diene block copolymer, a ratio (wA/wB) of the weight fraction wA of all of the polymer blocks [A] in the entire block copolymer relative to the weight fraction wB of all of the polymer blocks [B] in the entire block copolymer is usually 20/80 or more, and preferably 30/70 or more, and is usually 60/40 or less, and preferably 55/45 or less. By setting the ratio wA/wB to be equal to or more than the lower limit value of the aforementioned range, heat resistance of the resin can be improved. By setting the ratio to the upper limit value or less, flexibility of the resin can be enhanced, and a barrier property of the resin can be stably and satisfactorily maintained. Further, the glass transition temperature of the block copolymer can be lowered and thereby the sealing temperature can be lowered. Consequently, when the resin film of the present invention is applied to an organic EL element, an organic semiconductor element, or the like, thermal degradation of the element can be suppressed. In addition, by setting the ratio (wA/wB) within the aforementioned range, the temperature range in which the resin film has rubber-elasticity can be widened, and the temperature range in which the electronic device has flexibility can be widened.

[Polymer Having Polar Group]

In the present invention, the resin preferably contains as the polymer a polymer having a polar group. When the resin contains a polymer having a polar group, adhesiveness between the resin film and the apparatus can be improved. Examples of such polar groups may include a carbonyl-containing group such as an alkoxysilyl group, a carboxyl group, and an acid anhydride group, an epoxy group, an amino group, and an isocyanate group. Among these, an alkoxysilyl group is preferable from the viewpoint of improving the adhesiveness to an inorganic substance, particularly an inorganic substance containing Si such as glasses or SiOx.

The polymer having a polar group is preferably a graft polymer containing a polar group-containing unit. The polar group-containing unit is a unit having a structure obtained by polymerizing a monomer having a polar group. However, the polar group-containing unit is not limited by the production method thereof.

A graft polymer containing a polar group-containing unit may be obtained by graft-polymerizing a monomer having a polar group to a certain polymer. Hereinafter, the polymer to be used for the reaction of such a graft polymerization is referred to as a "pre-reaction polymer", for the sake of distinguishing this polymer from the polymer contained in the resin of the resin film of the present invention. Examples of the pre-reaction polymers may include the same polymers as those exemplified above as polymers that may be employed as the main component of the resin.

Examples of the monomers having a polar group may include ethylenic unsaturated silane compounds having an alkoxy group such as vinyltrimethoxysilane, vinyltriethoxysilane, allyltrimethoxysilane, allyltriethoxysilane, dimethoxymethylvinylsilane, diethoxymethylvinylsilane, p-styryltrimethoxysilane, p-styryltriethoxysilane, 3-methacryloxypropyltrimethoxysilane, 3-methacryloxypropylmethyldimethoxysilane, 3-methacryloxypropyltriethoxysilane, 3-methacryloxypropylmethyldiethoxysilane, 3-acryloxypropyltrimethoxysilane, 3-acryloxypropyltriethoxysilane, and 2-norbornene-5-yltrimethoysilane.

By the reaction of the pre-reaction polymer with a monomer having a polar group, a polar group can be introduced into the pre-reaction polymer to obtain a graft polymer containing a polar group-containing unit. When an alkoxysilyl group is introduced as a polar group, the amount of the alkoxysilyl group to be introduced is usually 0.1 part by weight or more, preferably 0.2 part by weight or more, and more preferably 0.3 part by weight or more, and is usually 10 parts by weight or less, preferably 5 parts by weight or less, and more preferably 3 parts by weight or less, relative to 100 parts by weight of the pre-reaction polymer. When the amount of the alkoxysilyl group to be introduced falls within the aforementioned range, it is possible to prevent the degree of cross-linking between the alkoxysilyl groups decomposed by water or the like from becoming excessively high, so that high adhesiveness can be maintained. Examples of substances having an alkoxysilyl group to be used for introducing an alkoxysilyl group and denaturing methods may include those described in prior art literatures such as International Publication No. WO2015/099079 and the like.

The amount of the alkoxysilyl group introduction may be measured by $^1$H-NMR spectrometry. When the amount of the alkoxysilyl group introduction is small, the number of times of integration may be increased to measure the amount of the alkoxysilyl group introduction.

Introduction of an alkoxysilyl group as a polar group into the pre-reaction polymer is called silane modification. In the silane modification, an alkoxysilyl group may be directly bonded to the pre-reaction polymer, and may also be bonded via a divalent organic group such as an alkylene group, for example. Hereinafter, the polymer obtained by silane modification of the pre-reaction polymer is also referred to as "silane-modified polymer".

In the present invention, as the silane-modified polymer, one or more polymers selected from a silane-modified product of a hydrogenated styrene-butadiene block copolymer, a silane-modified product of a hydrogenated styrene-butadiene-styrene block copolymer, a silane-modified product of a hydrogenated styrene-isoprene block copolymer, and a silane-modified product of a hydrogenated styrene-isoprene-styrene block copolymer are preferable.

The weight-average molecular weight (Mw) of the silane-modified polymer is usually 20000 or more, preferably 30000 or more, and more preferably 35000 or more, and is usually 200000 or less, preferably 100000 or less, and more preferably 70000 or less. The weight-average molecular weight of the polymer may be measured as a polystyrene-equivalent value by gel permeation chromatography using tetrahydrofuran as a solvent. The molecular weight distribution (Mw/Mn) of the polymer is preferably 4 or less, more preferably 3 or less, and particularly preferably 2 or less, and is preferably 1 or more. By keeping the weight-average molecular weight Mw and the molecular weight distribution Mw/Mn of the polymer within the aforementioned ranges, mechanical strength and heat resistance of the resins can be improved.

The silane-modified polymer has excellent adhesiveness to a material such as glass, an inorganic substance, and a metal, for example. Therefore, when the element of the organic EL light emitting device is sealed by the resin film of the present invention, the adhesiveness between the resin film and the element can be particularly increased. Consequently, even after exposure to a high-temperature and high-humidity environment usually performed in reliability evaluation of an organic EL light emitting device for an extended period of time, the resin film can maintain sufficient adhesion.

[2.2. Hygroscopic Particle]

The hygroscopic particles dispersed in the resin have the primary particle diameter of 200 nm or less. When the primary particle diameter of the hygroscopic particles is equal to or less than 200 nm, the thickness of the resin film can be uniformized. The primary particle diameter of the hygroscopic particles is preferably 150 nm or less, and more preferably 100 nm or less. When the primary particle diameter of the hygroscopic particles is small, an internal haze value can be reduced and transparency of the resin film can be enhanced.

The primary particle diameter of the hygroscopic particles is preferably 3 nm or more, and particularly preferably 10 nm or more. When the primary particle diameter of the hygroscopic particles is equal to or more than the aforementioned lower limit value, the particles can be dispersed with a small amount of the dispersant, making it possible to improve hygroscopicity while reducing an adverse effect of the dispersant. In the present invention, the primary particle diameter refers to the number-average particle diameter of the primary particles. The primary particle diameter (the number-average particle diameter) of the hygroscopic particles may be measured in a state of dispersion in which the particles are dispersed in a solvent using a particle diameter measuring device employing a dynamic light scattering method. Further, as another method, the measurement may be performed with a film form by directly observing the particles in a cross section of the film with an electron microscope and obtaining an average value of the particle diameter.

In the present invention, the hygroscopic particle is a particle having a weight change ratio, which is determined by allowing the particles to stand at 20° C. and 90% RH for 24 hours, within a specific range. The specific range of the weight change ratio is normally 3% or more, preferably 10% or more, and more preferably 15% or more. Although there is no particular limitation regarding the upper limit of the weight change ratio, the upper limit is preferably 100% or less. When the hygroscopic particles having such high hygroscopicity are used, water can be sufficiently absorbed with a small amount of the hygroscopic particles. Consequently, in a case where the resin is a thermoplastic elastomer, the characteristics of rubber originally possessed by the thermoplastic elastomer is not inhibited, which is advantageous.

The aforementioned weight change ratio may be calculated by the following formula (A1). In the following formula (A1), W1 represents the weight of the particles before being allowed to stand in the environment of 20° C. and 90% Rh and W2 represents the weight of the particles after being allowed to stand in the environment of 20° C. and 90% Rh for 24 hours.

$$\text{Weight change ratio } (\%)=(W2-W1)/W1\times 100 \quad (A1)$$

Examples of the material contained in the hygroscopic particles may include: a basic water absorbent such as a compound (an oxide, a hydroxide, a salt, etc.) that contains alkali metal, alkali earth metal, and aluminum but not silicon (e.g., barium oxide, magnesium oxide, calcium oxide, strontium oxide, aluminum hydroxide, hydrotalcite, etc.), an organic metallic compound described in Japanese Patent Application Laid-Open No. 2005-298598 A, and clay containing a metal oxide; and an acidic water absorbent such as an inorganic compound containing silicon (e.g., silica gel, nano-porous silica, and zeolite).

As the material of the hygroscopic particles, one or more types of substances selected from the group consisting of zeolite and hydrotalcite are preferable. Zeolite has a particularly high water absorption capacity and, for example, in a case where zeolite is allowed to stand at 20° C. and 90% RH for 24 hours, it can easily achieve the high weight change ratio of 10% to 30%. Further, as zeolite releases water by drying, zeolite is reusable. As the material of the hygroscopic particles described above, one type thereof may be solely used, and two or more types thereof may also be used in combination at any ratio.

In the present invention, the absolute value of the difference in refractive index between the resin and the hygroscopic particle is 0.05 or less. When the absolute value of the difference in refractive index between the resin and the hygroscopic particle falls within the aforementioned range, the internal haze can be reduced and transparency of the resin film can be improved. The absolute value of the difference in refractive index between the resin and the hygroscopic particle is preferably 0.03 or less.

The refractive index of the hygroscopic particles may be measured by the standard liquid method. Specifically, 2 or 3 drops of a standard liquid reagent whose refractive index is known are dropped on a glass substrate and mixed with the hygroscopic particles to prepare a liquid mixture. This operation is carried out using standard liquid reagents having various refractive indices (Cargille standard refractive index liquids manufactured by Moritex Corp.), and the refractive index of the standard liquid reagent resulting in the transparent liquid mixture is adopted as the refractive index of each species of particles. On the other hand, the refractive index of the resin is determined by preparing the resin molded in a film shape and measuring the refractive index using an Abbe refractometer or a spectroscopic ellipsometer with a wavelength of 589 nm.

The amount of the hygroscopic particles in the resin is preferably 5% by weight or more, and more preferably 10% by weight or more or more, and is preferably 60% by weight or less, preferably 40% by weight or less, and more preferably 30% by weight or less. When the amount of the hygroscopic particles is equal to or more than the lower limit value of the aforementioned range, the water intrusion preventing effect of the resin film can be improved. Further, when the amount of the hygroscopic particles is equal to or less than the upper limit value of the aforementioned range, transparency, flexibility, and processability of the resin film can be improved.

[2.3. Dispersant]

In the present invention, the resin film includes the dispersant. The dispersant has a function of improving the dispersibility of the hygroscopic particles in the resin. Examples of the dispersant may include a commercially available dispersant such as "ARON (registered trademark)" and "JURYMER (registered trademark)" series manufactured by Toagosei Co., Ltd., "AQUALIC (registered trademark)" series manufactured by Nippon Shokubai Co., Ltd, "FLOREN (registered trademark)" series manufactured by Kyoeisha Chemical Co., Ltd., "DISPARLON (registered trademark)" series manufactured by Kusumoto Chemicals, Ltd., "Sokalan (registered trademark)" series manufactured by BASF SE, "DISPERBYK (registered trademark)" series manufactured by BYK-Chemie, "SOLSPERSE (registered trademark)" series manufactured by The Lubrizol Corp., and "AJISPER" series manufactured by Ajinomoto Fine-Techno Co., Inc. The dispersant may be those being composed of a skeleton for achieving adsorption to the hygroscopic particles and a skeleton affecting interaction and compatibility with the resin and the solvent.

Examples of the skeleton for achieving adsorption to the hygroscopic particles may include an amino group, a carboxyl group, a phosphate group, an amine salt, a carboxylate salt, a phosphate salt, an ether group, a hydroxyl group, an amido group, an aromatic vinyl group, and an alkyl group. If the hygroscopic particles are acidic hygroscopic particles, the skeleton for achieving adsorption is preferably basic (the basic dispersant), and, if the hygroscopic particles are basic hygroscopic particles, the skeleton for achieving adsorption is preferably acidic (the acidic dispersant), although a nonionic dispersant may also be used.

The lower limit value of an acid value or a base value (an amine value) of the dispersant is preferably 20 mgKOH/g or more, and more preferably 50 mgKOH/g or more. The upper limit value of the acid value or the base value is preferably 200 mgKOH/g or less, and more preferably 160 mgKOH/g or less. When the dispersant having the acid value or the base value (the amine value) within these ranges is selected, the particles can be efficiently dispersed in a short period of time. On the other hand, examples of the skeleton affecting interaction and compatibility with the resin and the solvent include a fatty acid, a polyamino, a polyether, a polyester, a polyurethane, and a polyacrylate. Further, the dispersant to be selected is preferably soluble in a nonpolar solvent. The nonpolar solvent generally has a low water content in the solvent and does not inhibit the performance of the hygroscopic particles. Examples of such a nonpolar solvent may include hexane, cyclohexane, toluene, benzene, and tetrahydrofuran.

Further, a silane coupling agent and the like manufactured by Shin-Etsu Chemical Co., Ltd. and The Dow Chemical Company may be used as the dispersant. In the case of the silane coupling agent, the part which involves in adsorption to the hygroscopic particles is called a hydrolyzable group, and the part which affects interaction and compatibility with the resin and the solvent is called a reactive functional group. Examples of the hydrolyzable group may include $-OCH_3$, $-OC_2H_5$, and $-OCOCH_3$. On the other hand, examples of the reactive functional group may include an amino group, an epoxy group, a methacrylic group, and a vinyl group. As such a dispersant, one type thereof may be solely used, and two or more types thereof may also be used in combination.

The amount of the dispersant is preferably 7 parts by weight or more, and more preferably 10 parts by weight or more, and is preferably 70 parts by weight or less, and more preferably 50 parts by weight or less, relative to 100 parts by weight of the hygroscopic particles. When the amount of the dispersant is equal to or more than the aforementioned lower limit value, excellent dispersion of the hygroscopic particles can be achieved to reduce the internal haze, and thereby high transparency can be achieved. When the amount of the dispersant is equal to or less than the aforementioned upper limit value, it becomes possible to prevent deterioration of adhesion between the resin film and the organic EL light-emitting device or the like caused by the dispersant.

[2.4. Optional Component]

The resin may contain an optional component in addition to the polymer. Examples of the optional components may include a plasticizer to adjust glass transition temperature and elastic modulus, a light stabilizer to improve weatherability and heat resistance, an ultraviolet absorber, an antioxidant, a lubricant, and inorganic fillers. As such optional components, one type thereof may be solely used, and two or more types thereof may also be used in combination.

Examples of the antioxidant may include a phosphorus-based antioxidant, a phenol-based antioxidant, and a sulfur-based antioxidant, and a phosphorus-based antioxidant causing less coloration is preferable.

Examples of the phosphorus-based antioxidants may include a monophosphite-based compound such as triphenylphosphite, diphenylisodecylphosphite, phenyldiisodecylphosphite, tris(nonylphenyl)phosphite, tris(dinonylphenyl)phosphite, tris(2,4-di-t-butylphenyl)phosphite, and 10-(3,5-di-t-butyl-4-hydroxybenzyl)-9,10-dihydro-9-oxa-10-phosphaphenanthrene-10-oxide; a diphosphite-based compound such as 4,4'-butylidene-bis(3-methyl-6-t-butylphenyl-di-tridecylphosphite), and 4,4'-isopropylidene-bis(phenyl-di-alkyl(C12-C15)phosphite); and compounds such as 6-[3-(3-t-butyl-4-hydroxy-5-methylphenyl) propoxy]-2,4,8,10-tetrakis-t-butyldibenzo[d,f][1.3.2]dioxaphosphepine, and 6-[3-(3,5-di-t-butyl-4-hydroxyphenyl) propoxy]-2,4,8,10-tetrakis-t-butyldibenzo[d,f][1.3.2] dioxaphosphepine.

Examples of the phenol-based antioxidants may include pentaerythrityl.tetrakis[3-(3,5-di-t-butyl-4-hydroxyphenyl) propionate], 2,2-thio-diethylene bis[3-(3,5-di-t-butyl-4-hydroxyphenyl)propionate], octadecyl-3-(3,5-di-t-butyl-4-hydroxyphenyl)propionate, 3,9-bis {2-[3-(3-t-butyl-4-hydroxy-5-methylphenyl)propionyloxy]-1,1-dimethylethyl}-2,4,8,10-tetraoxaspiro [5,5]undecane, and 1,3,5-trimethyl-2,4,6-tris(3,5-di-t-butyl-4-hydroxybenzyl) benzene.

Examples of the sulfur-based antioxidants may include compounds such as dilauryl-3,3'-thiodipropionate, dimyristyl-3,3'-thiodipropionate, distearyl-3,3'-thiodipropionate, laurylstearyl-3,3'-thiodipropionate, pentaerythritol-tetrakis-(β-lauryl-thio-propionate), and 3,9-bis(2-dodecylthioethyl)-2,4,8,10-tetraoxaspiro[5,5]undecane.

The amount of the antioxidant is usually 0.01 part by weight or more, preferably 0.05 part by weight or more, and more preferably 0.1 part by weight or more, and is usually 1 part by weight or less, preferably 0.5 part by weight or less, and more preferably 0.3 part by weight or less, relative to 100 parts by weight of the main component polymer. Although the durability of the resin film can be improved by using the antioxidant in an amount that is not less than the lower limit value in the aforementioned range, it is difficult to achieve further improvement by excessive use thereof beyond the upper limit.

[3. Configuration of Resin Film]

On one surface or both surfaces of the resin film of the present invention, an optional layer may be disposed for the convenience of storage, transportation, a use application, and the like. As example of the optional layer may be a release film. Specifically, the resin film may be bonded to the release film to obtain a multilayered product. In a case where the resin film is used as an adhesive film, the resin film formed in the multilayered product can be easily stored and transported, which is preferable. Examples of the release film may include a polyethylene terephthalate (PET) film that has been subjected to a release treatment.

The thickness of the resin film of the present invention is preferably 0.1 µm or more, more preferably 1 µm or more, further preferably 3 µm or more, and particularly preferably 5 µm or more, and is preferably 1,000 µm or less, more preferably 100 µm or less, further preferably 50 µm or less, and particularly preferably 16 µm or less. When the thickness of the resin film is equal to or more than the aforementioned lower limit value, effective water absorption can be easily achieved, and intrusion of water can thereby be easily prevented. When the thickness of the resin film is equal to or less than the aforementioned upper limit value, flexibility of the resin film of the present invention can be improved.

The storage elastic modulus of the resin film of the present invention at 25° C. is preferably $10^7$ Pa or more, and more preferably $2 \times 10^7$ Pa or more, and is preferably $10^9$ Pa or less, and more preferably $5 \times 10^8$ Pa or less. When the storage elastic modulus of the resin film at 25° C. falls within the aforementioned range, the resin film exhibits rubber elasticity in a normal use temperature environment and thus is preferably used in a flexible device that is required to have a bending property.

The storage elastic modulus of the resin film at 25° C. may be measured using a dynamic viscoelasticity device under a condition of a frequency of 1 Hz.

The internal haze of the resin film of the present invention is preferably 6.0% or less, more preferably 3.0% or less, and further preferably 1.0% or less. When the internal haze is equal to or less than the aforementioned range, transparency of the resin film can be improved, and the resin film can therefore be preferably used in a place requiring light transmission in the organic EL light-emitting device and the like. The internal haze may be measured using a turbidimeter.

Although the glass transition temperature of the resin constituting the resin film is not particularly limited, the glass transition temperature is preferably 40° C. or higher, and more preferably 70° C. or higher, and is usually 200° C. or lower, preferably 180° C. or lower, and more preferably 160° C. or lower. Further, for example, in a case of using the thermoplastic elastomer including a block copolymer, a proper balance between adhesiveness at the time of sealing an element and flexibility after sealing can be achieved by adjusting the glass transition temperature by changing the weight ratio of each polymer block.

The method for producing the resin film of the present invention is not particularly limited, and any method may be used. For example, the production may be performed by mixing respective components constituting the resin film (the polymer, the hygroscopic particles, the dispersant, and other components to be added if needed) to obtain a mixture and applying the mixture onto a substrate such as a PET film that has been subjected to a release treatment, followed by drying. Examples of the method for mixing the components constituting the resin film may include a method in which the polymer is made in a molten state and kneaded with the components other than the polymer using a kneader such as a twin-screw kneader, a roll, a brabender, and an extruder; and a method in which the components other than the polymer is dissolved or dispersed in an appropriate solvent and mixed with a solution of the polymer, and then the solvent is removed to collect the resin including other components, although the method is not limited to these examples.

[4. Use Application of Resin Film]

The resin film of the present invention may be used in a use application such as a supporting substrate, insulation, adhesion, and sealing in the electronic device. In these use applications, for example, in a case where the resin film is used for an adhesion purpose (as an adhesive layer), the resin film of the present invention is interposed between two layers that need to be bonded together, and is then subjected to a treatment for expressing adhesion property, thereby effecting bonding of these two bonding object layers.

The treatment for expressing adhesion property may specifically be a so-called hot-melt treatment. That is, the resin film of the present invention is heated, and, if necessary, a treatment of applying pressure between the two bonding object layers may be performed. The treatment is performed at a temperature of preferably Tg or higher, and more preferably Tg+50° C. or higher. Tg herein represents the glass transition temperature of the resin constituting the resin film. If the resin has a plurality of glass transition temperatures, Tg described above represents the highest glass transition temperature of them. This makes it possible to achieve excellent adhesion. The upper limit of the treatment temperature is preferably Tg+50° C. or lower, and more preferably Tg+30° C. or lower. By performing the treatment at the temperature that is not higher than the upper limit, migration of the hygroscopic particles and the dispersant to the outermost surface of the resin film can be effectively prevented. As a result, a chemical reaction between the hygroscopic particle and the like and the bonding object layers can be prevented, and an adverse physical effect caused by a secondary particle of the hygroscopic particles can also be prevented.

[5. Electronic Device]

The electronic device of the present invention includes the resin film for an electronic device of the present invention. Examples of such an electronic device may include an organic EL light-emitting device, a solar cell, a touch panel, and various electrodes (ITO, a copper electrode, a tin electrode, a solder electrode, etc.). Of these, an organic EL light-emitting device including the resin film of the present invention as the sealing film is preferable. When the resin film of the present invention is used as the sealing film in the organic EL light-emitting device which is susceptible to water and oxygen, the resin film can effectively express the effect of preventing the intrusion of water. The organic EL light-emitting device including the resin film of the present invention will be described below as a specific example of the electronic device of the present invention.

The organic EL light-emitting device may include a substrate, and an electrode and a light emitting layer provided on the substrate. Specifically, the device may include a substrate such as a glass plate, a first electrode provided on the surface of the substrate, a light-emitting layer provided on the surface of the first electrode, and a second electrode further provided on the surface of the light-emitting layer. When one of the first electrode and the second electrode is made as a transparent electrode and the other is made as a reflection electrode (or a combination of a transparent electrode and a reflection layer), light emission toward a transparent electrode side can be achieved in response to application of electric current to the electrodes.

The organic EL light-emitting device may further include a gas barrier layer for preventing the intrusion of water into the light-emitting layer. The organic EL light-emitting device may have a configuration including the substrate, the gas barrier layer, and the electrodes and the light-emitting layer provided therebetween, wherein the electrodes and the light-emitting layer is sealed by the substrate and the gas barrier layer. The organic EL light-emitting device may include the resin film of the present invention as a layer interposed between the second electrode and the gas barrier layer. When such a configuration is adopted to thereby render the resin film of the present invention functioning as an adhesive layer for bonding the second electrode and the gas barrier layer together, the intrusion of water into the layer such as the light-emitting layer is prevented by high adhesion property, and thus it becomes possible to obtain an organic EL light-emitting device in which the layer such as the light-emitting layer is effectively sealed.

The gas barrier layer included in the organic EL light-emitting device may be a layered body of the resin film and the gas barrier layer. For example, a gas barrier layered body including the resin film and an inorganic barrier layer formed on the surface of the resin film may be used as the gas barrier layer.

Preferable examples of the inorganic material which the inorganic barrier layer may contain may include: metal; an oxide, a nitride, and a nitroxide of silicon; an oxide, a nitride, and a nitroxide of aluminum; diamond-like carbon (DLC); and a mixed material of two or more thereof. Of these, in terms of transparency, a material including silicon is preferable and an oxide and a nitroxide of silicon are particularly preferable. Further, in terms of compatibility with the resin film, DLC is particularly preferable.

Examples of the oxide of silicon may include $SiO_x$. Herein, x is preferably $1.4<x<2.0$ from the viewpoint of achieving both transparency and water vapor barrier property of the inorganic barrier layer. Further, as the oxide of silicon, SiOC may also be mentioned.

Examples of the nitride of silicon may include $SiN_y$. Herein, y is preferably $0.5<y<1.5$ from the viewpoint of achieving both transparency and water vapor barrier property of the inorganic barrier layer.

Examples of the nitroxide of silicon may include $SiO_pN_q$. Herein, if greater emphasis is placed on improvement in adhesion property of the inorganic barrier layer, the inorganic barrier layer is preferably made as an oxygen-rich film by satisfying $1<p<2.0$ and $0<q<1.0$. If greater emphasis is placed on improvement in water vapor barrier property of the inorganic barrier layer, the inorganic barrier layer is preferably made as a nitrogen-rich film by satisfying $0<p<0.8$ and $0.8<q<1.3$.

Examples of the oxide, nitride, and nitroxide of aluminum may include $AlO_x$, $AlN_y$, and $AlO_pN_q$. Of these, $SiO_pN_q$, $AlO_x$, and a mixture thereof are particularly preferable from the viewpoint of inorganic barrier property.

The inorganic barrier layer may be formed, for example, on the surface of the resin film serving as a supporting body by a film-forming method such as a vapor deposition method, a sputtering method, an ion plating method, an ion beam assisted vapor deposition method, an arc discharge plasma vapor deposition method, a thermal CVD method, and a plasma CVD method. Of these, a chemical vapor growth method such as a thermal CVD method and a plasma CVD method is preferably used. According to the chemical vapor growth method, a flexible inorganic barrier layer can be formed by adjusting a gas component used in the film formation. Further, the flexible inorganic barrier layer thus obtained can follow deformation of the resin film and a size change of the resin film under a high temperature and high humidity environment. Further, according to the chemical vapor growth method, a film can be formed at a high film forming rate under a low-vacuum environment, and thus excellent gas barrier property can be achieved.

In the gas barrier layered body, the inorganic barrier layer may be provided on both surfaces of the resin film. However, the inorganic barrier layer is usually provided on one surface. In this case, the inorganic barrier layer may be provided so as to face the inside of the organic EL light-emitting device. Alternatively, the inorganic barrier layer may be provided so as to face the outside of the organic EL light-emitting device. The inorganic barrier layer is preferably provided so as to face the inside of the organic EL light-emitting device from the viewpoint of preventing the damage to the inorganic barrier layer after production of the device.

The organic EL light-emitting device may further include an optional layer such as a hole injection layer, a hole transport layer, an electron transport layer, and an electron injection layer between the first electrode and the second electrode. The organic EL light-emitting device may include an optional configuration such as wiring for supplying an electric current to the first electrode and the second electrode, and a peripheral structure for sealing the light-emitting layer.

The organic EL light-emitting device may include the light-emitting layer in any optional manner. For example, the electronic device of the present invention may be a display device including the light-emitting layer as a pixel for displaying an image, a backlight device including the light-emitting layer as a light emitter for supplying light, or a light source device such as a lighting device.

EXAMPLES

Hereinafter, the present invention will be specifically described by illustrating Examples. However, the present invention is not limited to the Examples described below. The present invention may be optionally modified for implementation without departing from the scope of claims of the present invention and its equivalents. In the following description, "%" and "part" representing quantity are on the basis of weight, unless otherwise specified. The operations described below were performed under the conditions of normal temperature and normal pressure, unless otherwise specified.

[Evaluation Methods]
[Young's Modulus, Tensile Elongation, and Tan δ of Resin]

The Young's modulus and the tensile elongation of the resin at 23° C. were measured according to JIS K7113. The loss tangent tan δ (the loss elastic modulus/the storage elastic modulus) of the resin of 40° C. or higher and 200° C.

or lower was measured using a dynamic viscoelasticity measuring device DMS6100 manufactured by Hitachi High-Tech Science Corp.

[Refractive Index]

The refractive index of the hygroscopic particles was measured by the standard liquid method. Specifically, 2 or 3 drops of a standard liquid reagent whose refractive index was known were dropped on a glass substrate and mixed with the hygroscopic particles to prepare a liquid mixture. This operation was carried out using standard liquid reagents having various refractive indices (Cargille standard refractive index liquids manufactured by MORITEX Corp.), and the refractive index of the standard liquid reagent resulting in the transparent liquid mixture was adopted as the refractive index of each species of particles. On the other hand, the refractive index of the resin was determined by preparing the resin molded in a film shape and measuring the refractive index using an Abbe refractometer with a wavelength of 589 nm.

[Method for Measuring Corrosion Starting Time of Ca Thin Film]

A 5 cm-square glass substrate 1 on which a Ca thin film is formed in a region of a square having each edge being 3 cm, and a 4 cm-square glass substrate 2 were prepared. Further, the release-treated PET film was peeled off from the multilayered product produced in Examples and Comparative Examples to obtain resin film 1. The resin film 1 was cut into a square having each edge being about 4.0 cm, to obtain the resin films 1 as samples.

The resin film 1 was placed on the glass substrate 1 and the glass substrate 2 was further placed on the resin film 1 such that each end of the glass substrate 2 was positioned 0.5 cm away from each corresponding end of the Ca thin film region. This stack was passed through a roll laminator having a roll temperature set at 110° C. under a pressure of 0.3 MPa for lamination to produce a glass layered body 1 having a layer configuration of (glass substrate 2)/(resin film 1)/(glass substrate 1). The glass layered body 1 thus obtained was stored under an environment of 60° C. and 90% RH and whether or not a color change occurred at an end portion of the Ca thin film region was observed about every 24 hours to measure the time when the color change in the end portion of the Ca thin film region started. Longer starting time of the color change in the end portion of the Ca thin film region is indicative of better water-permeating ability of the resin film.

[Method for Measuring Internal Haze]

A 5 cm-square glass substrate 3, and a 5 cm-square glass substrate 4 were prepared. Further, the release-treated PET film was peeled off from the multilayered product produced in Examples and Comparative Examples to obtain the resin film 1.

The resin film 1 was placed on the glass substrate 3, and the glass substrate 4 was further placed on the resin film 1. This stack was passed through the roll laminator having a roll temperature set at 110° C. under a pressure of 0.3 MPa for lamination to produce a glass layered body 2 having a layer configuration of (glass substrate 3)/(resin film 1)/(glass substrate 4). The internal haze of the glass layered body 2 thus obtained was measured using a turbidimeter ("NDH-2000" manufactured by Nippon Denshoku Industries Co., Ltd.).

[Method for Measuring Storage Elastic Modulus of Resin Film]

The release-treated PET film was peeled off from the multilayered product produced in Examples and Comparative Examples to obtain the resin film. The storage elastic modulus of the resin film at −50° C. to 200° C. was measured using a dynamic viscoelasticity measuring device DMS6100 manufactured by Hitachi High-Tech Science Corp. under a condition of a frequency of 1 Hz. The storage elastic modulus at 25° C. is shown in Tables.

[Adhesion Evaluation Test (Cross-Cut Peel Test)]

A 5 cm-square glass substrate 5, and the multilayered product produced in Examples and Comparative Examples were prepared.

Each multilayered product was placed on the glass substrate 5 with the release-treated PET film on the upper side. This stack was passed through the roll laminator having a roll temperature set at 110° C. under a pressure of 0.3 MPa for lamination, and further stored in an oven of 80° C. for 1 hour. In this manner, a glass layered body 3 having a layer configuration of (release-treated PET film)/(resin film 1)/(glass substrate 5) was produced. Only the release-treated PET film was peeled off from this glass layered body 3, and eleven streaks of notches were made on the resin film at intervals of 1 mm in longitudinal and latitudinal directions using a cutter to form a total of 100 grids (10×10) of 1 mm square. A cellophane adhesive tape was then affixed to the surface of the grids and stripped off rapidly. The number of the grids left unpeeled was evaluated by the following evaluation criteria. Higher number of the grids left unpeeled is indicative of better adhesion to the glass substrate.

<Evaluation Criteria>

OK: the number of grids left unpeeled was 90 or more relative to the total number of grids (100).

NG: the number of grids left unpeeled was 89 or less relative to the total number of grids (100).

Example 1

(1-1. Production of Hydrogenated Block Copolymer)

A hydrogenated product of a block copolymer (a hydrogenated block copolymer) having a triblock structure in which polymer blocks [A] are bonded to both ends of a polymer block [B] was produced by the following procedure using styrene as an aromatic vinyl compound and isoprene as a linear conjugated diene compound.

A reaction vessel equipped with a stirrer, in which an internal atmosphere had been sufficiently replaced with nitrogen, was charged with 256 parts of dehydrated cyclohexane, 25.0 parts of dehydrated styrene, and 0.615 part of n-dibutyl ether. While the mixture was stirred at 60° C., 1.35 parts of n-butyllithium (a 15% cyclohexane solution) was added to the mixture to initiate polymerization. The mixture was further allowed to react at 60° C. for 60 minutes while being stirred. The polymerization conversion rate at this point was 99.5% (the polymerization conversion rate was measured by gas chromatography, hereinafter the same).

Subsequently, 50.0 parts of dehydrated isoprene was added and continuously stirred at the same temperature for 30 minutes. The polymerization conversion rate at this point was 99%.

Subsequently, 25.0 parts of dehydrated styrene was further added and stirred at the same temperature for 60 minutes. The polymerization conversion rate at this point was almost 100%.

Subsequently, 0.5 part of isopropyl alcohol was added to the reaction liquid to terminate the reaction. Thus a solution (i) containing a block copolymer was obtained.

The block copolymer in the solution (i) thus obtained had the weight-average molecular weight (Mw) of 44,900 and the molecular weight distribution (Mw/Mn) of 1.03.

Subsequently, the solution (i) was transferred to a pressure-resistant reaction vessel equipped with a stirrer. Then, 4.0 parts of a silica-alumina supported nickel catalyst (E22U, a carrying amount of nickel of 60%; manufactured by JGC Chemical Industry Company) as a hydrogenation catalyst and 350 parts of dehydrated cyclohexane were added to the solution (1) and mixed. After replacing the atmosphere inside the reaction vessel with hydrogen gas, the block copolymer was hydrogenated by performing a hydrogenation reaction by further supplying hydrogen to the solution while stirring at a temperature of 170° C. and a pressure of 4.5 MPa for 6 hours to obtain a solution (iii) containing a hydrogenated product (ii) of the block copolymer. The hydrogenated product (ii) in the solution (iii) had a weight-average molecular weight (Mw) of 45,100 and a molecular weight distribution (Mw/Mn) of 1.04.

After the completion of the hydrogenation reaction, the solution (iii) was filtered to remove the hydrogenation catalyst. Subsequently, 1.0 part of a xylene solution prepared by dissolving 0.1 part of a phosphorus-based antioxidant 6-[3-(3-t-butyl-4-hydroxy-5-methylphenyl)propoxy]-2,4,8,10-tetrakis-t-butyldibenzo[d,f][1.3.2]dioxaphosphepine ("SUMILIZER (registered trademark) GP" manufactured by Sumitomo Chemical Industries Co., Ltd., hereinafter referred to as "antioxidant A") was added to and dissolved in the filtered solution (iii) to obtain a solution (iv).

Subsequently, the solution (iv) was sequentially filtered through Zeta Plus (registered trademark) filter 30H (manufactured by Cuno, a pore diameter of 0.5 μm to 1 μm) and another filter made of a metal fiber (a pore diameter of 0.4 μm, manufactured by Nichidai Co., Ltd.) to remove minute solid components. The solvents cyclohexane and xylene, as well as other volatile components, were removed from the filtered solution (iv) using a cylinder-type concentration dryer (product name "Kontro" manufactured by Hitachi, Ltd.) at a temperature of 260° C. and a pressure of 0.001 MPa or less. Then, the solid content in a molten state was extruded in a stranded shape from a die directly connected to the concentration dryer described above. The extruded product was cooled and cut with a pelletizer to obtain 85 parts of pellets (v) containing the hydrogenated product of the block copolymer and the antioxidant A. The hydrogenated product of the block copolymer (the hydrogenated block copolymer) in the pellets (v) thus obtained had the weight-average molecular weight (Mw) of 45,000 and the molecular weight distribution (Mw/Mn) of 1.08. Further, the hydrogenation rate was 99.9%.

(1-2. Production of Silane-Modified Product of Hydrogenated Block Copolymer)

To 100 parts of the pellets (v) obtained in (1-1), 2.0 parts of vinyl trimethoxysilane and 0.2 part of di-t-butyl peroxide were added to obtain a mixture. This mixture was kneaded using a twin-screw extruder at a barrel temperature of 210° C. and a retention time of 80 seconds to 90 seconds. The kneaded mixture was extruded and cut with a pelletizer to obtain pellets (vi) of silane-modified product of the hydrogenated block copolymer. A test piece in a film shape was prepared from the pellets (vi), and the glass transition temperature Tg of the test piece was evaluated by the tan δ peak obtained by the dynamic viscoelasticity measuring device, and founded to be 124° C. Further, the peak value of tan δ of the pellets (vi) between 40° C. or higher and 200° C. or lower was 1.3. The pellets (vi) had the Young's modulus of 0.5 GPa and the tensile elongation of 550% at 23° C. Further, the pellets (vi) had the refractive index (n1) measured by the Abbe refractometer of 1.50.

(1-3. Production of Resin Film)

10 g of zeolite particles (the number-average particle diameter of primary particles in a dispersed state of 50 nm and the refractive index (n2) of 1.5), 5 g of a dispersant having a basic adsorption group (the amine value of 140 mgKOH/g, product name "DISPERBYK-109" manufactured by BYK-Chemie, hereinafter the same), and 185 g of cyclohexane were mixed and stirred using a bead mill to prepare a 5% zeolite dispersion 1. Subsequently, 40 g of the pellets (vi) obtained in (1-2) and 160 g of cyclohexane were mixed to dissolve the pellets. Thus a 20% polymer solution was produced.

The zeolite dispersion 1 and the polymer solution were weighed and then mixed together at equal amounts to produce a zeolite-containing polymer solution. The zeolite-containing polymer solution was applied onto a release-treated PET film (a PET film one of whose surfaces was subjected to a release treatment, product name MRV38, manufactured by Mitsubishi Plastics, Inc., hereinafter the same) using an applicator, and dried using a hot plate of 110° C. for 3 minutes to volatilize the solvent. In this manner, a multilayered product including the release-treated PET film and the resin film formed thereon was obtained. The resin film in the multilayered product contained 18.1% of zeolite and had a thickness of 10 μm. The multilayered product was stored under a nitrogen environment to prevent water absorption and evaluated for the corrosion starting time of the Ca thin film, the internal haze, the storage elastic modulus, and the adhesion property in accordance with the evaluation methods described above.

Example 2

A multilayered product was obtained and evaluated by the same operation as that in Example 1 except that the following 5% zeolite dispersion 2 was used instead of the 5% zeolite dispersion 1 in (1-3) in Example 1. The resin film in the multilayered product contained 19.4% of zeolite and had a thickness of 10 μm.

The 5% zeolite dispersion 2 was produced by mixing and stirring, using a bead mill, 10 g of zeolite particles (the number-average particle diameter of primary particles in a dispersed state of 190 nm and the refractive index (n2) of 1.50), 1.5 g of a dispersant having a basic adsorption group, and 188.5 g of cyclohexane.

Example 3

A multilayered product was obtained and evaluated by the same operation as that in Example 1 except that the following 5% hydrotalcite dispersion 3 was used instead of the 5% zeolite dispersion 1 in (1-3) in Example 1. The resin film in the multilayered product contained 19.6% of hydrotalcite and had a thickness of 10 μm.

The 5% hydrotalcite dispersion 3 was produced by mixing and stirring, using a bead mill, 10 g of hydrotalcite particles (the number-average particle diameter of primary particles in a dispersed state of 50 nm and the refractive index (n2) of 1.52), 1 g of a dispersant having an acidic adsorption group (the acid value of 101 mgKOH/g, product name "DISPERBYK-102" manufactured by BYK-Chemie, hereinafter the same), and 189 g of cyclohexane.

Comparative Example 1

(C1-1. Production of Resin Film)

10 g of magnesium oxide particles (the number-average particle diameter of primary particles in a dispersed state of 50 nm and the refractive index (n2) of 2.00), 10 g of a dispersant having a basic adsorption group, and 180 g of cyclohexane were mixed and stirred using a bead mill to produce a 5% magnesium oxide dispersion C1. Subsequently, 40 g of the pellets (vi) obtained in (1-2) in Example 1 and 160 g of cyclohexane were mixed to dissolve the pellets. Thus a 20% polymer solution was produced.

The magnesium oxide dispersion C1 and the polymer solution were weighed and then mixed in the ratio of 1:2 to produce a magnesium oxide-containing polymer solution. The magnesium oxide-containing polymer solution was applied onto the release-treated PET film using an applicator, and dried using a hot plate of 110° C. for 3 minutes to volatilize the solvent. In this manner, a multilayered product including the release-treated PET film and the resin film formed thereon was obtained. The resin film in the multilayered product contained 10% of magnesium oxide dispersed therein and had a thickness of 10 μm. The multilayered product was stored under a nitrogen environment to prevent water absorption and evaluated for the corrosion starting time of the Ca thin film, the internal haze, the storage elastic modulus, and the adhesion property in accordance with the evaluation methods described above.

Comparative Example 2

(C2-1. Production of Resin Film)

10 g of hydrotalcite particles (the number-average particle diameter of primary particles in a dispersed state of 500 nm and the refractive index (n2) of 1.55), 10 g of a dispersant having an acidic adsorption group, and 180 g of cyclohexane were mixed and stirred using a bead mill to produce a 5% hydrotalcite dispersion C2. Subsequently, 40 g of the pellets (vi) obtained in (1-2) in Example 1 and 160 g of cyclohexane were mixed to dissolve the pellets. Thus a 20% polymer solution was produced.

The hydrotalcite dispersion C2 and the polymer solution were weighed and then mixed in the ratio of 1:2 to produce a hydrotalcite-containing polymer solution. The hydrotalcite-containing polymer solution was applied onto the release-treated PET film using an applicator, and dried using a hot plate of 110° C. for 3 minutes to volatilize the solvent. In this manner, a multilayered product including the release-treated PET film and the resin film formed thereon was obtained. The resin film in the multilayered product contained 10% of hydrotalcite dispersed therein and had a thickness of 10 μm. The multilayered product was stored under a nitrogen environment to prevent water absorption and evaluated for the corrosion starting time of the Ca thin film, the internal haze, the storage elastic modulus, and the adhesion property in accordance with the evaluation methods described above.

Comparative Example 3

(C3-1. Production of Resin Film)

10 g of magnesium oxide particles (the number-average particle diameter of primary particles in a dispersed state of 20 nm and the refractive index (n2) of 2.00), 10 g of a dispersant having a basic adsorption group, and 180 g of cyclohexane were mixed and stirred using a bead mill to produce a 5% magnesium oxide dispersion C3. Subsequently, 40 g of the pellets (vi) obtained in (1-2) in Example 1 and 160 g of cyclohexane were mixed to dissolve the pellets. Thus a 20% polymer solution was produced.

The magnesium oxide dispersion C3 and the polymer solution were weighed and then mixed in the ratio of 1:2 to produce a magnesium oxide-containing polymer solution. The magnesium oxide-containing polymer solution was applied onto the release-treated PET film using an applicator, and dried using a hot plate of 110° C. for 3 minutes to volatilize the solvent. In this manner, a multilayered product including the release-treated PET film and the resin film formed thereon was obtained. The resin film in the multilayered product contained 10% of magnesium oxide dispersed therein and had a thickness of 10 μm. The multilayered product was stored under a nitrogen environment to prevent water absorption and evaluated for the corrosion starting time of the Ca thin film, the internal haze, the storage elastic modulus, and the adhesion property in accordance with the evaluation methods described above.

Comparative Example 4

(C4-1. Production of Resin Film)

10 g of hydrotalcite particles (the number-average particle diameter of primary particles in a dispersed state of 600 nm and the refractive index (n2) of 1.51), 10 g of a dispersant having an acidic adsorption group, and 180 g of cyclohexane were mixed and stirred using a bead mill to produce a 5% hydrotalcite dispersion C4. Subsequently, 40 g of the pellets (vi) obtained in (1-2) in Example 1 and 160 g of cyclohexane were mixed to dissolve the pellets. Thus a 20% polymer solution was produced.

The hydrotalcite dispersion C4 and the polymer solution were weighed and then mixed in the ratio of 1:2 to produce a hydrotalcite-containing polymer solution. The hydrotalcite-containing polymer solution was applied onto the release-treated PET film using an applicator, and dried using a hot plate of 110° C. for 3 minutes to volatilize the solvent. In this manner, a multilayered product including the release-treated PET film and the resin film formed thereon was obtained. The resin film in the multilayered product contained 10% of hydrotalcite dispersed therein and had a thickness of 10 μm. The multilayered product was stored under a nitrogen environment to prevent water absorption and evaluated for the corrosion starting time of the Ca thin film, the internal haze, the storage elastic modulus, and the adhesion property in accordance with the evaluation methods described above.

Evaluation results were shown in Table 1 and Table 2 (these may be collectively referred to hereinafter as "Tables").

In Tables, "corrosion time (hours)" refers to the corrosion starting time of the Ca thin film and "adhesion property" refers to the adhesive test. In Tables, the column of results of adhesion property shows the ratio of the number of grids remaining unpeeled relative to the total number of grids (the number of grids remaining unpeeled/the total number of grids) and the column of evaluation of adhesion property shows the evaluation results in accordance with the evaluation criteria described above.

Table 1 and Table 2 show, in addition to the evaluation results, the type of the silane-modified polymer in the resin used in each Example, the refractive index (n1) of the resin, the type of the hygroscopic particles and the concentration of the hygroscopic particles in the resin film, the refractive index (n2) and the primary particle diameter of the hygroscopic particles, the absolute value of the difference between the refractive index of the resin and the refractive index of the hygroscopic particles (|n1−n2|), the amount (parts by weight) of the dispersant relative to 100 parts by weight of the hygroscopic particles, and the thickness of the resin film.

In Tables, "silane-modified SIS" refers to "silane-modified product of hydrogenated styrene-isoprene-styrene block copolymer".

TABLE 1

|  |  | Ex. 1 | Ex. 2 | Ex. 3 |
|---|---|---|---|---|
| Resin | Type of silane-modified polymer | Silane-modified SIS | Silane-modified SIS | Silane-modified SIS |
|  | Refractive index n1 | 1.50 | 1.50 | 1.50 |
| Hygroscopic particle | Type | Zeolite | Zeolite | Hydrotalcite |
|  | Concentration | 18.1% | 19.4% | 19.6% |
|  | Refractive index n2 | 1.50 | 1.50 | 1.52 |
|  | Particle diameter | 50 nm | 190 nm | 50 nm |
| |n1 − n2| |  | 0 | 0 | 0.02 |
| Amount of dispersant relative to 100 parts by weight of particles (parts by weight) |  | 50 | 15 | 10 |
| Film thickness (μm) |  | 10 | 10 | 10 |
| Corrosion time (hours) |  | 580 | 580 | 750 |
| Internal haze (%) |  | 0.7 | 1.0 | 1.0 |
| 25° C. Storage elastic modulus (Pa) |  | $2 \times 10^8$ | $2 \times 10^8$ | $2 \times 10^8$ |
| Adhesion property | Results | 100/100 | 100/100 | 100/100 |
|  | Evaluation | OK | OK | OK |

TABLE 2

|  |  | Comp. Ex. 1 | Comp. Ex. 2 | Comp. Ex. 3 | Comp. Ex. 4 |
|---|---|---|---|---|---|
| Resin | Type of silane-modified polymer | Silane-modified SIS | Silane-modified SIS | Silane-modified SIS | Silane-modified SIS |
|  | Refractive index n1 | 1.50 | 1.50 | 1.50 | 1.50 |
| Hygroscopic particle | Type | MgO | Hydrotalcite | MgO | Hydrotalcite |
|  | Concentration | 10% | 10% | 10% | 10% |
|  | Refractive index n2 | 2.00 | 1.55 | 2.00 | 1.51 |
|  | Particle diameter | 50 nm | 500 nm | 20 nm | 600 nm |
| |n1 − n2| |  | 0.5 | 0.05 | 0.5 | 0.01 |
| Amount of dispersant relative to 100 parts by weight of particles (parts by weight) |  | 100 | 100 | 100 | 100 |
| Film thickness (μm) |  | 10 | 10 | 10 | 10 |
| Corrosion time (hours) |  | 600 | 400 | 400 | 400 |
| Internal haze (%) |  | 24.5 | 14.5 | 28.0 | 3.5 |
| 25° C. Storage elastic modulus (Pa) |  | $2 \times 10^8$ | $2 \times 10^8$ | $2 \times 10^8$ | $2 \times 10^8$ |
| Adhesion property | Results | 30/100 | 0/100 | 0/100 | 0/100 |
|  | Evaluation | NG | NG | NG | NG |

The resin films obtained in Examples 1 to 3 prevent the intrusion of water, have high transparency, and are excellent in adhesion property. Accordingly they can be usefully applied to the sealing film for electronic devices and the like.

The invention claimed is:

1. A resin film for an electronic device comprising:
a resin containing a polymer;
hygroscopic particles dispersed in the resin and having a primary particle diameter of 200 nm or less; and
a dispersant, wherein
an absolute value of a difference in refractive index between the resin and the hygroscopic particles is 0.05 or less,
an amount of the dispersant is 7 parts by weight or more and 50 parts by weight or less relative to 100 parts by weight of the hygroscopic particles,
the polymer is a hydrogenated styrene-isoprene-styrene block copolymer in which both an unsaturated bond of isoprene and an aromatic ring are hydrogenated, the polymer having an alkoxysilyl group introduced thereto,
a ratio (wA/wB) of the weight fraction wA of all of the styrene blocks in the entire block copolymer relative to the weight fraction wB of all of the isoprene blocks in the entire block copolymer is 20/80 or more and 60/40 or less,
the hygroscopic particles are one or more substances selected from the group consisting of zeolite and hydrotalcite, and
an acid value or a base value of the dispersant is 20 mgKOH/g or more, and 200 mgKOH/g or less.

2. The resin film for an electronic device according to claim 1, wherein the resin is a thermoplastic resin.

3. The resin film for an electronic device according to claim 2, wherein the thermoplastic resin is a thermoplastic elastomer.

4. The resin film for an electronic device according to claim 1, wherein the polymer having an alkoxysilyl group is a graft polymer containing an alkoxysilyl group-containing unit.

5. The resin film for an electronic device according to claim 1, wherein a storage elastic modulus at 25° C. thereof is $10^7$ Pa or more and $10^9$ Pa or less.

6. The resin film for an electronic device according to claim 1, wherein a thickness thereof is 0.1 μm or more and 1000 μm or less.

7. The resin film for an electronic device according to claim 1, wherein an internal haze thereof is 6.0% or less.

8. An electronic device comprising the resin film for an electronic device according to claim 1.

* * * * *